(12) United States Patent
Sawada (10) Patent No.: US 10,636,741 B2
(45) Date of Patent: Apr. 28, 2020

(54) PRINTED WIRING BOARD

(71) Applicant: IBIDEN CO., LTD., Ogaki-shi (JP)

(72) Inventor: Yoji Sawada, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 16/232,144

(22) Filed: Dec. 26, 2018

(65) Prior Publication Data

US 2019/0198446 A1 Jun. 27, 2019

(30) Foreign Application Priority Data

Dec. 25, 2017 (JP) ................. 2017-247514

(51) Int. Cl.
*H01L 23/498* (2006.01)
*H01L 23/48* (2006.01)
(Continued)

(52) U.S. Cl.
CPC .... *H01L 23/5386* (2013.01); *H01L 23/49827* (2013.01); *H01L 23/49838* (2013.01); *H01L 24/16* (2013.01); *H01L 25/18* (2013.01); *H05K 1/0298* (2013.01); *H05K 1/115* (2013.01); *H01L 24/14* (2013.01); *H01L 24/81* (2013.01); *H01L 2224/1403* (2013.01); *H01L 2224/16145* (2013.01); *H01L 2224/16225* (2013.01); *H01L 2224/16227* (2013.01); *H01L 2224/16237* (2013.01); *H01L 2224/16238* (2013.01);
(Continued)

(58) Field of Classification Search
CPC ..... H01L 23/498; H01L 23/48; H01L 23/486; H05K 1/02; H05K 1/09; H05K 1/11; H05K 1/18; H05K 3/00; H05K 3/06; H05K 3/10; H05K 3/32; H05K 3/46
USPC ........ 174/262, 251, 255, 257, 264; 361/728, 361/761, 763, 764, 767
See application file for complete search history.

(56) References Cited

U.S. PATENT DOCUMENTS 10,143,092 B2 * 11/2018 Mikado ................ H05K 3/4697
2005/0287714 A1 * 12/2005 Walk ..................... H01L 21/481
438/127

(Continued)

FOREIGN PATENT DOCUMENTS

JP H06-053349 A 2/1994

*Primary Examiner* — Xiaoliang Chen
(74) *Attorney, Agent, or Firm* — Oblon, McClelland, Maier & Neustadt, L.L.P.

(57) ABSTRACT

A printed wiring board includes a core substrate, and a build-up layer formed on the substrate. The substrate includes core material, third conductor layer, fourth conductor layer, and through-hole conductors. The build-up layer is formed on the core material and third conductor layer and includes insulating layers, first conductor layers, and via conductors. The build-up layer has central area and outer peripheral area such that the via conductors include central area via conductors and outer peripheral area via conductors, diameter of central area via conductor is smaller than diameter of outer peripheral area via conductor, the outermost first conductor layer includes first pads to mount first electronic component and second pads to mount second electronic component, the first and second pads are connected to each other via the central via conductors, and the lowermost insulating layer does not have the via conductors in the central area of the build-up layer.

20 Claims, 4 Drawing Sheets

(51) Int. Cl.

| | | |
|---|---|---|
| *H05K 1/02* | (2006.01) | |
| *H05K 1/09* | (2006.01) | |
| *H05K 1/11* | (2006.01) | |
| *H05K 1/18* | (2006.01) | |
| *H05K 3/00* | (2006.01) | |
| *H05K 3/06* | (2006.01) | |
| *H05K 3/10* | (2006.01) | |
| *H05K 3/32* | (2006.01) | |
| *H05K 3/46* | (2006.01) | |
| *H01L 23/538* | (2006.01) | |
| *H01L 25/18* | (2006.01) | |
| *H01L 23/00* | (2006.01) | |

(52) U.S. Cl.
CPC ............... *H01L 2224/81191* (2013.01); *H01L 2224/81193* (2013.01); *H01L 2924/00014* (2013.01); *H01L 2924/15192* (2013.01); *H01L 2924/3511* (2013.01); *H05K 3/4644* (2013.01); *H05K 2201/09227* (2013.01); *H05K 2201/09727* (2013.01); *H05K 2201/10515* (2013.01); *H05K 2201/10522* (2013.01); *H05K 2201/10674* (2013.01)

(56) References Cited

U.S. PATENT DOCUMENTS

| | | | | |
|---|---|---|---|---|
| 2007/0263364 A1* | 11/2007 | Kawabe | ............ | H01L 23/49822 361/728 |
| 2010/0044081 A1* | 2/2010 | Morimoto | ............ | H01L 21/4857 174/251 |
| 2011/0121445 A1* | 5/2011 | Mori | .................... | H01L 23/5389 257/693 |
| 2012/0043371 A1* | 2/2012 | Hayashi | ................ | B23K 1/0016 228/208 |
| 2013/0025782 A1* | 1/2013 | Higo | ...................... | B32B 37/02 156/306.6 |
| 2014/0097007 A1* | 4/2014 | Nagai | ................. | H05K 1/0265 174/257 |
| 2014/0118976 A1* | 5/2014 | Yoshikawa | ....... | H01L 23/49822 361/763 |
| 2014/0225701 A1* | 8/2014 | Morita | ................ | H01F 17/0013 336/200 |
| 2014/0311772 A1* | 10/2014 | Mizutani | ................ | H05K 3/429 174/251 |
| 2016/0020164 A1* | 1/2016 | Terui | ........................ | C25D 7/00 174/251 |
| 2016/0037647 A1* | 2/2016 | Shimizu | ............... | H05K 3/4697 361/764 |
| 2016/0044789 A1* | 2/2016 | Shimizu | ................. | H05K 1/185 174/251 |
| 2016/0073515 A1* | 3/2016 | Shimizu | ................. | H05K 1/185 361/761 |
| 2016/0143137 A1* | 5/2016 | Baek | ..................... | H05K 3/4682 361/767 |
| 2016/0268189 A1* | 9/2016 | Mikado | ............... | H01L 23/3677 |
| 2016/0316566 A1* | 10/2016 | Sakai | ..................... | H05K 1/185 |
| 2017/0278781 A1* | 9/2017 | Taguchi | ............ | H01L 23/49822 |

* cited by examiner

PRINTED WIRING BOARD

CROSS-REFERENCE TO RELATED APPLICATIONS

The present application is based upon and claims the benefit of priority to Japanese Patent Application No. 2017-247514, filed Dec. 25, 2017, the entire contents of which are incorporated herein by reference.

BACKGROUND OF THE INVENTION

Field of the Invention

The present invention relates to a printed wiring board having a central area and an outer peripheral area surrounding the central area.

Description of Background Art

Japanese Patent Laid-Open Publication No. HEI 6-53349 describes a multichip module substrate. According Japanese Patent Laid-Open Publication No. HEI 6-53349, two LSIs are mounted on one substrate. The two LSIs are connected to each other by multiple wiring layers. The entire contents of this publication are incorporated herein by reference.

SUMMARY OF THE INVENTION

According to one aspect of the present invention, a printed wiring board includes a core substrate, and a first build-up layer formed on the core substrate. The core substrate includes a core material, a third conductor layer formed on a first surface of the core material, a fourth conductor layer formed on a second surface of the core material on the opposite side with respect to the first surface, and through-hole conductors penetrating through the core material and connecting the third conductor layer and the fourth conductor layer. The first build-up layer is formed on the first surface of the core material and the third conductor layer and includes first resin insulating layers, first conductor layers formed on the first resin insulating layers respectively, and first via conductors penetrating through the first resin insulating layers and connecting the first conductor layers. The first build-up layer has a central area and an outer peripheral area surrounding the central area formed such that the first via conductors include central area first via conductors formed in the central area and outer peripheral area first via conductors formed in the outer peripheral area, that a diameter of each of the central area first via conductors is smaller than a diameter of each of the outer peripheral area first via conductors, that the first resin insulating layers include a lowermost first resin insulating layer covering the first surface of the core material and the third conductor layer and include an outermost first resin insulating layer, that the first conductor layers include an outermost first conductor layer formed on the outermost first resin insulating layer and including first pads positioned to mount a first electronic component to the first build-up layer and second pads positioned to mount a second electronic component to the first build-up layer, that the first and second pads are connected to each other via the central area first via conductors, and that the lowermost first resin insulating layer does not have the first via conductors formed in the central area of the first build-up layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Embodiments will now be described with reference to the accompanying drawings, wherein like reference numerals designate corresponding or identical elements throughout the various drawings.

Figure 1:
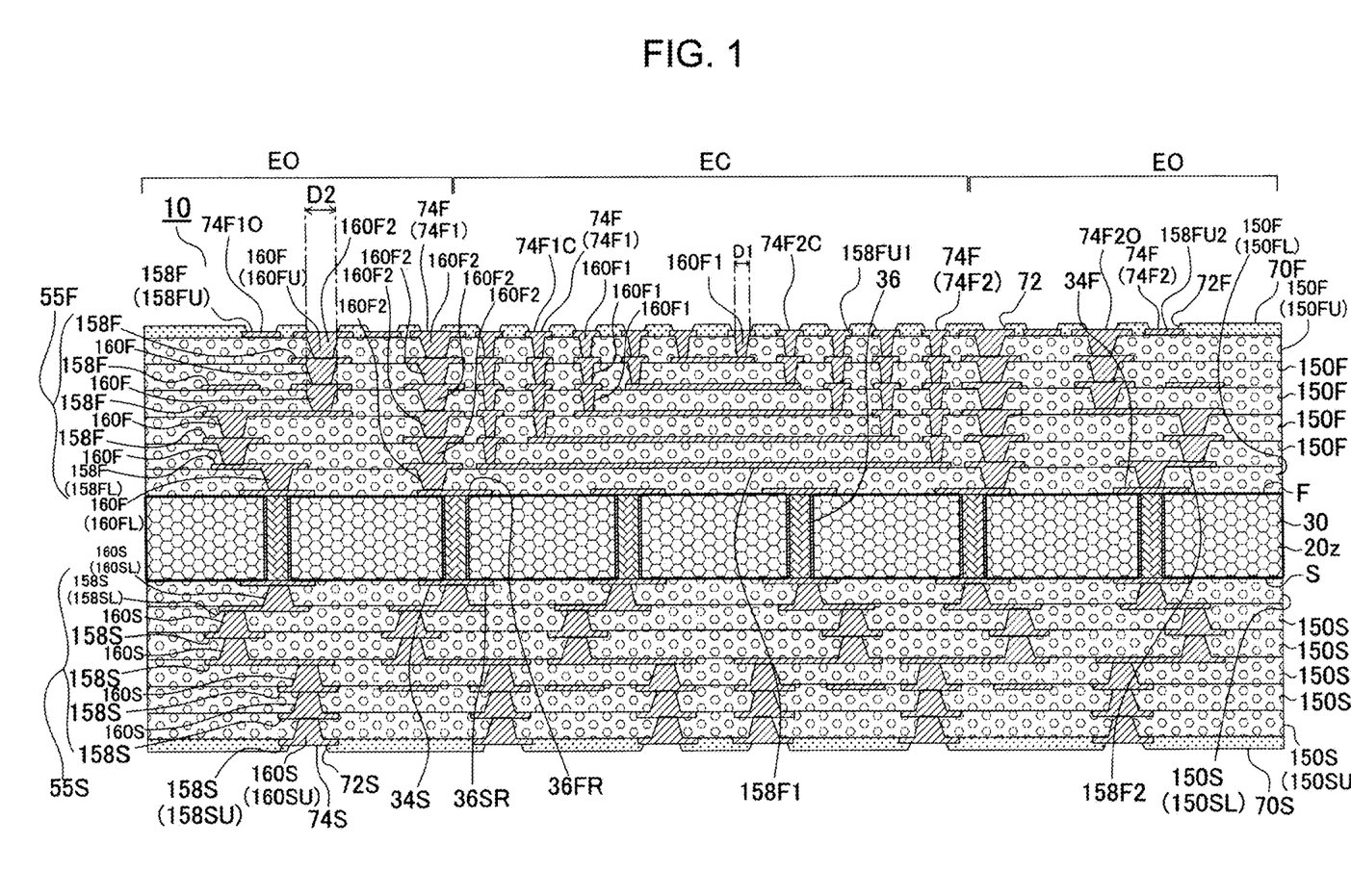
FIG. 1 is a cross-sectional view of a build-up wiring board according to an embodiment of the present invention.

FIG. 1 is a cross-sectional view of a build-up wiring board 10 of an embodiment.

The build-up wiring board 10 has a core substrate 30 having a first surface (F) and a second surface (5) on an opposite side with respect to the first surface (F), a first build-up layer (55F) formed on the first surface (F) of the core substrate 30, a second build-up layer (55S) formed on the second surface (S) of the core substrate 30, a first solder resist layer (70F) formed on the first build-up layer (55F), and a second solder resist layer (70S) formed on the second build-up layer (55S).

The core substrate 30 has a core layer (20z) having a first surface (F) and a second surface (5) on an opposite side with respect to the first surface (F), a third conductor layer (34F) formed on the first surface (F) of the core layer (20z), and a fourth conductor layer (34S) formed on the second surface (S) of the core layer (20z). The core substrate 30 further has through-hole conductors 36 penetrating the core layer (20z). The third conductor layer (34F) and the fourth conductor layer (34S) are connected to each other via the through-hole conductors 36. The third conductor layer (34F) has first through-hole lands (36FR) respectively formed directly on the through-hole conductors 36. The fourth conductor layer (34S) has second through-hole lands (36SR) respectively formed directly on the through-hole conductors 36.

The second build-up layer (55S) has alternately formed second resin insulating layers (150S) and second conductor layers (158S). The number of the second resin insulating layers (150S) is preferably 2 or more. The number of the second conductor layers (158S) is preferably 2 or more.

The second resin insulating layer (150S) that is directly formed on the second surface (S) of the core substrate 30 and on the fourth conductor layer (34S) is a lowermost second resin insulating layer (150SL). The second resin insulating layer (150S) that is positioned outermost is an outermost second resin insulating layer (150SU).

Among the second conductor layers (158S), the second conductor layer (158S) that is positioned outermost is an outermost second conductor layer (158SU). The outermost second conductor layer (158SU) is formed on the outermost second resin insulating layer (150SU).

The second build-up layer (55S) further has second via conductors (160S) penetrating the second resin insulating layers (150S). The conductor layers sandwiching the second resin insulating layers (150S) therebetween are connected to each other by the second via conductors (160S). The fourth conductor layer (34S) and a second conductor layer (lowermost second conductor layer) (158SL) on the lowermost second resin insulating layer (150SL) are connected to each other by lowermost second via conductors (160SL) penetrating the lowermost second resin insulating layer (150SL). The outermost second conductor layer (158SU) and the second conductor layer (158S) sandwiching the outermost second resin insulating layer (150SU) therebetween are connected to each other by outermost second via conductors (160SU) penetrating the outermost second resin insulating layer (150SU).

The second solder resist layer (70S) having second openings (72S) is formed on the second build-up layer (55S). The outermost second conductor layer (158SU) exposed from the second openings (72S) forms third pads (74S) for connecting to a motherboard.

The first build-up layer (55F) has alternately formed first resin insulating layers (150F) and first conductor layers (158F). The number of the first resin insulating layers (150F) is preferably 2 or more. The number of the first conductor layers (158F) is preferably 2 or more.

The first resin insulating layer (150F) that is directly formed on the first surface (F) of the core substrate 30 and on the third conductor layer (34F) is a lowermost first resin insulating layer (150FL). The first resin insulating layer (150F) that is positioned outermost is an outermost first resin insulating layer (150FU).

Among the first conductor layers (158F), the first conductor layer (158F) that is positioned outermost is an outermost first conductor layer (158FU). The outermost first conductor layer (158FU) is formed on the outermost first resin insulating layer (150FU).

The first build-up layer (55F) further has first via conductors (160F) penetrating the first resin insulating layers (150F). The conductor layers sandwiching the first resin insulating layers (150F) therebetween are connected to each other by the first via conductors (160F). The third conductor layer (34F) and a first conductor layer (lowermost first conductor layer) (158FL) on the lowermost first resin insulating layer (150FL) are connected to each other by lowermost first via conductors (160FL) penetrating the lowermost first resin insulating layer (150FL). The outermost first conductor layer (158FU) and the first conductor layer (158F) sandwiching the outermost first resin insulating layer (150FU) therebetween are connected to each other by outermost first via conductors (160FU) penetrating the outermost first resin insulating layer (150FU).

The first solder resist layer (70F) having first openings (72F) is formed on the first build-up layer (55F). The outermost first conductor layer (158FU) exposed from the first openings (72F) forms pads (74F) for connecting to an electronic component. The pads (74F) are formed to include first pads (74F1) for mounting a first electronic component and second pads (74F2) for mounting a second electronic component.

The second build-up layer (55S) can be removed from the build-up wiring board 10 of FIG. 1. Further, the first solder resist layer (70F) and the second solder resist layer (70S) can be removed. A printed wiring board is formed by the core substrate 30 and the first build-up layer (55F) on the core substrate 30. The first build-up layer (55F) in the printed wiring board is formed by the first resin insulating layers (150F), the first conductor layers (158F) and the first via conductors (160F). A solder resist layer can be formed on both sides of the printed wiring board.

Figure 4A:
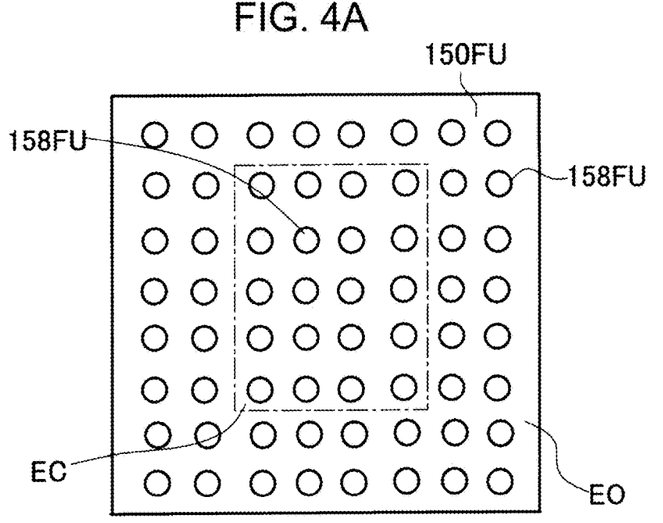
FIG. 4A is a plan view of the build-up wiring board of the embodiment.

FIG. 4A is a plan view of the build-up wiring board 10 of the embodiment. FIG. 4A illustrates the outermost first conductor layer (158FU) and the outermost first resin insulating layer (150FU) exposed from the outermost first conductor layer (158FU). FIG. 1 and FIG. 4A illustrate a central area (EC) and an outer peripheral area (EO) surrounding the central area (EC). The central area (EC) and the outer peripheral area (EO) are formed in the first build-up layer (55F). The first build-up layer (55F) is divided into the central area (EC) and the outer peripheral area (EO).

Figure 4B:
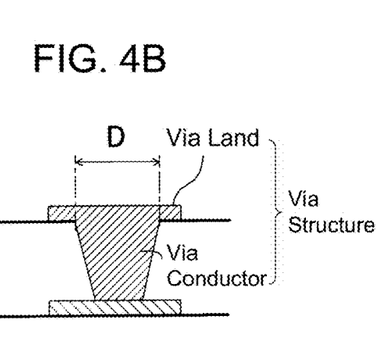
FIG. 4B is an explanatory diagram of a via structure.

FIG. 4B illustrates a via structure. The via structure is formed by a via conductor penetrating a resin insulating layer and a via land formed directly on the via conductor. The via conductor and the via land are formed at the same time. The via conductor has a via conductor diameter (D) at an interface between the via land and the via conductor. The interface between the via land and the via conductor coincides with an interface between a conductor layer and a resin insulating layer in the build-up layer.

The first via conductors (160F) are stratified into first via conductors (central area first via conductors) (160F1) formed in the central area (EC) and first via conductors (outer peripheral area first via conductors) (160F2) formed in the outer peripheral area (EO).

A diameter (D1) of each of the central area first via conductors (160F1) is smaller than a diameter (D2) of each of the outer peripheral area first via conductors (160F2). As a result, for example, the outer peripheral area (EO) can have a strength greater than that of the central area (EC). Warpage of the build-up wiring board 10 can be reduced. Similarly, warpage of the printed wiring board can be reduced.

For example, the central area first via conductors (160F1) each have a diameter (D1) of 10 μm. The outer peripheral area first via conductors (160F2) each have a diameter (D2) of 25 μm. A ratio ((diameter (D2))/(diameter (D1))) of the diameter (D2) to the diameter (D1) is preferably larger than 2 and smaller than 4. A wiring length between a first electronic component (110A) and a second electronic component (110B) can be shortened. Warpage of the build-up wiring board can be reduced. Therefore, data can be transmitted at a high speed from the first electronic component (110A) to the second electronic component (110B). Deterioration of data can be prevented.

The outermost first conductor layer (158FU) is stratified into an outermost first conductor layer (central area outermost first conductor layer) (158FU1) formed in the central area (EC) and an outermost first conductor layer (outer peripheral area outermost first conductor layer) (158FU2) formed in the outer peripheral area (EO).

Figure 2:
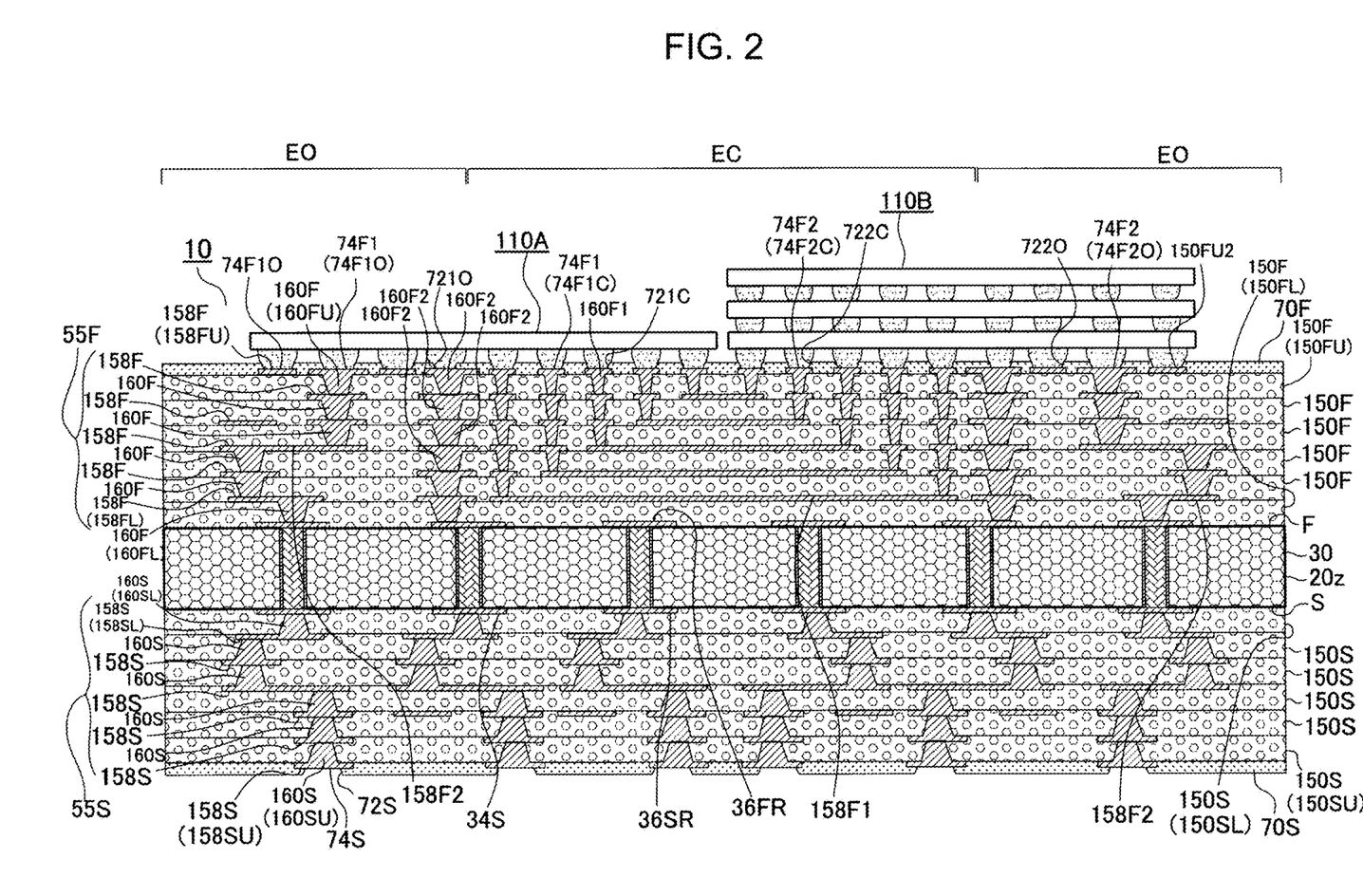
FIG. 2 is a cross-sectional view of a build-up wiring board according to an applied example of the embodiment of the present invention.

FIG. 2 is an application example of the build-up wiring board 10 of the embodiment.

As illustrated in FIG. 2, the first electronic component (110A) and the second electronic component (110B) are mounted on the outermost first conductor layer (158FU). An example of the first electronic component (110A) is a logic IC, and an example of the second electronic component (110B) is a memory. The outermost first conductor layer (158FU) includes the first pads (74F1) for mounting the first electronic component (110A) and the second pads (74F2) for mounting the second electronic component (110B). The first pads (74F1) are stratified into first pads (central area first pads) (74F1C) formed in the central area (EC) and first pads (outer peripheral area first pads) (74F1O) formed in the outer peripheral area (EO). Further, the second pads are stratified into second pads (central area second pads)

(74F2C) formed in the central area (EC) and second pads (outer peripheral area second pads) (74F2O) formed in the outer peripheral area (EO).

A size of each of the central area first pads (74F1C) is substantially equal to a size of each of the central area second pads (74F2C). A size of each of the outer peripheral area first pads (74F1O) is substantially equal to a size of each of the outer peripheral area second pads (74F2O). A size of each of first openings (721C) that respectively expose the central area first pads (74F1C) is substantially equal to a size of each of first openings (722C) that respectively expose the central area second pads (74F2C). A size of each of first openings (721O) that respectively expose the outer peripheral area first pads (74F1O) is substantially equal to a size of each of first openings (722O) that respectively expose the outer peripheral area second pads (74F2O). The size of each of the central area first pads (74F1C) is smaller than the size of each of the outer peripheral area first pads (74F1O). The size of each of the central area second pads (74F2C) is smaller than the size of each of the outer peripheral area second pads (74F2O). A wiring density of the central area (EC) can be higher than a wiring density of the outer peripheral area (EO).

The central area first pads (74F1C) and the central area second pads (74F2C) are connected to each other via the central area first via conductors (160F1) The central area first pads (74F1C) and the central area second pads (74F2C) are not connected to each other via the outer peripheral area first via conductors (160F2). A wiring length between the first electronic component (110A) and the second electronic component (110B) can be shortened. A transmission speed can be increased. Data delay can be suppressed.

The first conductor layers (158F) are each stratified into a first conductor layer (central area first conductor layer) (158F1) formed in the central area (EC) and a first conductor layer (outer peripheral area first conductor layer) (158F2) formed in the outer peripheral area (EO). The central area first pads (74F1C) and the central area second pads (74F2C) are connected to each other via the central area first via conductors (160F1) and the central area first conductor layers (158F1). The central area first pads (74F1C) and the central area second pads (74F2C) are not connected to each other via the outer peripheral area first conductor layers (158F2). A wiring length between the first electronic component (110A) and the second electronic component (110B) can be shortened. A transmission speed can be increased. Data delay can be suppressed.

The central area first conductor layers (158F1) and the outer peripheral area first conductor layers (158F2) are electrically independent. The central area first conductor layers (158F1) and the outer peripheral area first conductor layers (158F2) are not electrically connected to each other.

The central area first via conductors (160F1) and the outer peripheral area first via conductors (160F2) are electrically independent. The central area first via conductors (160F1) and the outer peripheral area first via conductors (160F2) are not electrically connected to each other.

Wirings (central area wirings) formed in the central area are formed by the central area first conductor layers (158F1) and the central area first via conductors (160F1). Wirings (outer peripheral area wirings) formed in the outer peripheral area are formed by the outer peripheral area first conductor layers (158F2) and the outer peripheral area first via conductors (160F2). The central area wirings and the outer peripheral area wirings are electrically independent. The central area wirings and the outer peripheral area wirings are not electrically connected to each other. Therefore, the central area first pads (74F1C) and the central area second pads (74F2C) are connected to each other only by the central area wirings. Deterioration of data is suppressed. According to the build-up wiring board 10 or the printed wiring board of the embodiment, the central area wirings are electrically independent in the build-up wiring board 10. The first electronic component (110A) and the second electronic component (110B) can be connected to each other only by the central area wirings. A data transmission speed can be increased.

The central area wirings are electrically independent in the build-up wiring board 10 or the printed wiring board. In the build-up wiring board 10 or the printed wiring board, the central area wirings are not electrically connected to the conductor layers (the third conductor layer (34F), the fourth conductor layer (34S) and the through-hole conductors 36) forming the core substrate. In the build-up wiring board 10 of FIG. 1, the central area wirings are not electrically connected to the second conductor layers (158S) or the second via conductors (160S) formed in the second build-up layer (55S). Therefore, deterioration of data transmitted from the first electronic component (110A) to the second electronic component (110B) (data transferred through the central area wiring) is suppressed. Further, a data transmission speed can be increased.

Figure 4C:
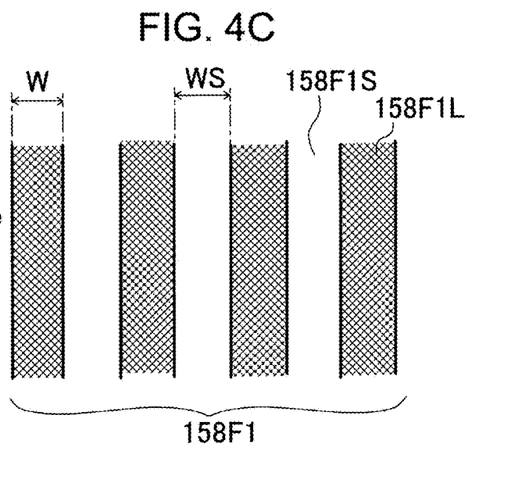
FIG. 4C is a plan view of a central area first conductor layer.

As illustrated in FIG. 4C, the central area first conductor layers (158F1) each include multiple central area first conductor circuits (158FIL) that are formed in parallel. Further, the central area first conductor layers (158F1) each have a central area first space (158FIS) between each pair of adjacent central area first conductor circuits (158FIL). The central area first conductor circuits (158FIL) each have a width (W) of 1.5 μm or more and 3.5 μm or less. The central area first space has a width (WS) of 1.5 μm or more and 3.5 μm or less.

The outer peripheral area first conductor layers (158F2) each include outer peripheral area first conductor circuits. The outer peripheral area first conductor circuits each have a width of 4 μm or more.

The wiring density of the central area (EC) is higher than the wiring density of the outer peripheral area (EO). A printed wiring board for mounting a sophisticated electronic component can be provided.

Figure 3:
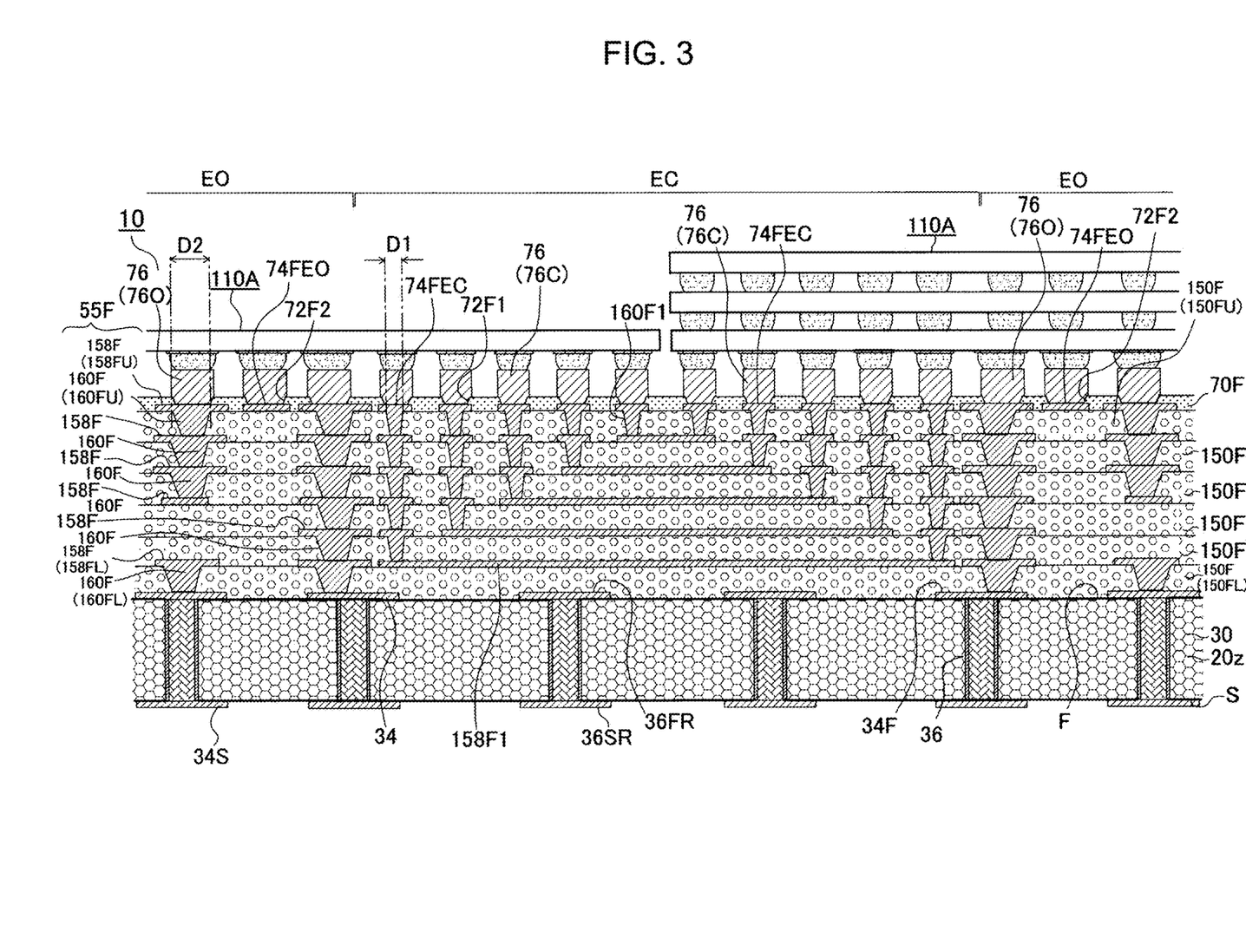
FIG. 3 is a cross-sectional view of a build-up wiring board according to another applied example of the embodiment.

FIG. 3 illustrates another application example of the printed wiring board or the build-up wiring board 10. Another stratification method of the pads for mounting the electronic components is described below. In the other example, the pads are stratified into central area pads (74FEC) formed in the central area (EC) and outer peripheral area pads (74FEO) formed in the outer peripheral area (EO). Further, the first openings (72F) exposing the pads are stratified into central area first openings (72F1) formed in the central area (EC) and outer peripheral area first openings (72F2) formed in the outer peripheral area (EO). Then, a size of each of the central area first openings (72F1) is smaller than a size of each of the outer peripheral area first openings (72F2). Therefore, a size of each of the central area pads (74FEC) is smaller than a size of each of the outer peripheral area pads (74FEO).

Figure 4D:
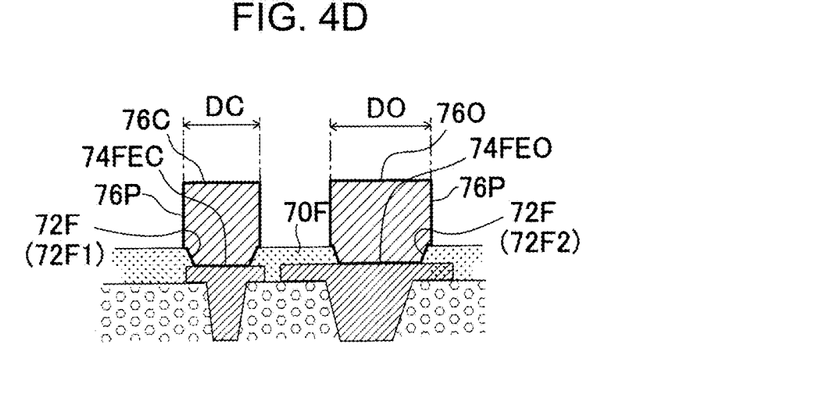
FIG. 4D is an enlarged view of metal posts.

As illustrated in FIG. 3, metal posts 76 for mounting the electronic components can be formed on the pads. The metal posts 76 are stratified into central area metal posts (76C) that are respectively formed on the central area pads (74FEC) and outer peripheral area metal posts (76O) that are respectively formed on the outer peripheral area pads (74FEO). An enlarged view of the metal posts (76C, 76O) is illustrated in FIG. 4D. The metal posts 76 are each formed by a portion formed in a first opening (72F) of the first solder resist layer (70F) and a portion (projecting portion) (76P) projecting from the first solder resist layer (70F). As illustrated in FIG. 4D, the projecting portion of each of the metal posts 76 has a diameter. A diameter (DC) of the projecting portion of each of the central area metal posts (76C) is smaller than a diameter (DO) of the projecting portion of each of the outer peripheral area metal posts (76O). A sophisticated electronic component can be mounted on the printed wiring board.

As illustrated in FIG. 2, all of the central area first pads (74F1C) are connected to the central area second pads (74F2C) via the central area first via conductors (160F1) and the central area first conductor layers (158F1). All of the central area second pads (74F2C) are connected to the central area first pads (74F1C) via the central area first via conductors (160F1) and the central area first conductor layers (158F1).

The central area first pads (74F1C) are not connected to the third pads (74S). The central area first pads (74F1C) are not connected to the outer peripheral area first pads (74F1O). The central area first pads (74F1C) are not connected to the outer peripheral area second pads (74F2O).

The central area second pads (74F2C) are not connected to the third pads (74S). The central area second pads (74F2C) are not connected to the outer peripheral area first pads (74F1O). The central area second pads (74F2C) are not connected to the outer peripheral area second pads (74F2O).

As illustrated in FIG. 2, all of the outer peripheral area first pads (74F1O) are connected to the third pads (74S) via the outer peripheral area first via conductors (160F2), the outer peripheral area first conductor layers (158F2), the third conductor layer (34F), the through-hole conductors 36, the fourth conductor layer (34S), the second conductor layers (158S), and the second via conductors (160S).

As illustrated in FIG. 2, all of the outer peripheral area second pads (74F2O) are connected to the third pads (74S) via the outer peripheral area first via conductors (160F2), the outer peripheral area first conductor layers (158F2), the third conductor layer (34F), the through-hole conductors 36, the fourth conductor layer (34S), the second conductor layers (158S), and the second via conductors (160S).

In the printed wiring board or the build-up wiring board 10 of the embodiment, there is no wiring that electrically connects a central area wiring to an outer peripheral area wiring. There is no wiring that electrically connects a central area wiring to a wiring in the core substrate. Wirings in the core substrate include the third conductor layer (34F), the fourth conductor layer (34S) and the through-hole conductors 36 that form the core substrate 30. In the build-up wiring board 10 of the embodiment, there is no wiring that electrically connects a central area wiring to a wiring in the second build-up layer. Wirings in the second build-up layer include the second conductor layers (158S) and the second via conductors (160S). In this way, in the printed wiring board or the build-up wiring board 10 of the embodiment, the central area wirings and the outer peripheral area wirings are electrically independent. In the printed wiring board or the build-up wiring board 10 of the embodiment, the central area wirings and the third pads (74S) are electrically independent. Therefore, even when the printed wiring board or the build-up wiring board 10 of the embodiment is mounted on a motherboard, data transmitted between the first electronic component (110A) and the second electronic component (110B) is unlikely to deteriorate. Interference between data transmitted in the central area and data transmitted in the outer peripheral area can be suppressed. Interference between data transmitted in the central area and data transmitted in the second build-up layer can be suppressed. A memory having a large capacity can be mounted on the printed wiring board or the build-up wiring board 10 of the embodiment.

A power supply wiring or a ground wiring is formed by the outer peripheral area first via conductors (160F2) connected to the outer peripheral area first pads (74F1O), and the outer peripheral area first conductor layers (158F2). A power supply wiring or a ground wiring is formed by the outer peripheral area first via conductors (160F2) connected to the outer peripheral area second pads (74F2O), and the outer peripheral area first conductor layers (158F2). The outer peripheral area first pads (74F1O) and the outer peripheral area second pads (74F2O) mainly connect to a power supply or the ground.

The printed wiring board or the build-up wiring board 10 of the embodiment can have a dedicated area where only data transmission between the electronic components is performed. For example, the central area functions as the dedicated area. A data transmission speed between the electronic components can be increased.

The diameter of each of the via conductors in the outer peripheral area is larger than the diameter of each of the via conductors in the central area. Further, the width of each of the conductor circuits in the outer peripheral area is larger than the width of each of the conductor circuits in the central area. Therefore, resistance of a power supply wiring or a ground wiring formed in the outer peripheral area can be reduced. For example, even when an electronic component such as a logic IC instantaneously consumes a large amount of power, variation in voltage of the electronic component can be suppressed. A malfunction of the electronic component can be prevented.

A diameter of each of the second via conductors (160S) is substantially equal to the diameter of each of the outer peripheral area first via conductors (160F2).

According to the embodiment of the present invention, the central area (EC) is independent. Therefore, a stress in the outer peripheral area (EO) is not transmitted to the central area (EC) via a wiring. A stress in the core substrate 30 is not transmitted to the central area (EC) via a wiring. A stress in the second build-up layer (55S) is not transmitted to the central area (EC) via a wiring. Even when the diameter of each of the via conductors and the width of each of the conductor circuits in the central area (EC) are small, connection reliability of the wirings in the central area can be increased.

As illustrated in FIG. 3, the first via conductors (160F) formed in the lowermost first resin insulating layer (150FL) are only the outer peripheral area first via conductors (160F2). There is no lowermost first via conductor (160FL) formed by a central area first via conductor (160F1). For example, there are outer peripheral area first via conductors (160F2) formed directly on the first through-hole lands (36FR). However, there is no central area first via conductor (160F1) formed directly on the first through-hole lands (36FR). There is no first via conductor (160F) formed directly on the first through-hole lands (36FR) positioned directly below the central area (EC). There are first via conductors (160F) formed directly on the first through-hole lands (36FR) positioned directly below the outer peripheral area (EO). As a result, the wirings in the core substrate and the central area wirings can be independent. The third pads (74S) and the central area wirings can be independent.

The diameter of each of the outer peripheral area first via conductors (160F2) is larger than the diameter of each of the central area first via conductors (160F1). The lowermost first via conductors (160FL) exist only in the outer peripheral area (EO). The lowermost first via conductors (160FL) do not exist in the central area (EC). As a result, a balance between the strength of the outer peripheral area and the strength of the central area can be adjusted by the first via conductors (160F). Warpage of the printed wiring board 10 can be controlled. Connection reliability between the first electronic component (110A) and the printed wiring board 10 and connection reliability between the second electronic component (110B) and the printed wiring board 10 can be increased. By controlling the warpage of the printed wiring board 10, deterioration of data and a decrease in transmission speed can be suppressed.

The printed wiring board of the embodiment has the outer peripheral area first via conductors (160F2) and the central area first via conductors (160F1). Therefore, as wirings for data transmission between the first electronic component (110A) and the second electronic component (110B), the first via conductors each having a small diameter can be used. A wiring density of the printed wiring board can be increased. The data transmission speed between the electronic components can be increased.

The first via conductors and the first conductor circuits forming the central area wirings each have a small diameter or a small width. Therefore, the central area wirings have a risk of a disconnection. However, the printed wiring board of the embodiment does not have the lowermost first via conductors (160FL) in the central area (EC). Therefore, a stress in the second build-up layer (55S) or a stress in the core substrate 30 is not directly transmitted to the central area wirings via the lowermost first via conductors (160FL). Since the outer peripheral area wirings and the central area wirings are independent, a stress in the outer peripheral area (EO) is not transmitted to the central area (EC). The risk of a disconnection of the central area wirings can be reduced. A decrease in reliability of the wirings can be suppressed.

The first via conductors and the first conductor circuits forming the outer peripheral area wirings each have a large diameter or a large width. These form a power supply wiring or a ground wiring. Therefore, the resistance of the power supply wiring or the resistance of the ground wiring can be reduced. By forming the outer peripheral area first via conductors (160F2) directly on the through-hole conductors 36, a wiring distance can be shortened. A power shortage of the electronic components can be suppressed.

A module substrate illustrated in FIG. 1 of Japanese Patent Laid-Open Publication No. HEI 6-53349 has an a layer, a b layer, a c layer and a d layer. In Japanese Patent Laid-Open Publication No. HEI 6-53349, the number of through holes decreases from the a layer toward the d layer. Therefore, strength of the a layer is thought to be higher than strength of the b layer. The strength of the b layer is thought to be higher than strength of the c layer. The strength of the c layer is thought to be higher than strength of the d layer. Therefore, the module substrate of Japanese Patent Laid-Open Publication No. HEI 6-53349 is thought to be easily warped. Japanese Patent Laid-Open Publication No. HEI 6-53349 relates to a multichip module substrate, and as illustrated in FIG. 1 of Japanese Patent Laid-Open Publication No. HEI 6-53349, two LSI chips are mounted on the module substrate. In the module substrate of Japanese Patent Laid-Open Publication No. HEI 6-53349, the number of the through holes formed in each layer is different between the layers. Further, multiple LSI chips are mounted on the module substrate of Japanese Patent Laid-Open Publication No. HEI 6-53349. Therefore, when the multichip module illustrated in FIG. 1 of Japanese Patent Laid-Open Publication No. HEI 6-53349 is subjected to a thermal shock, it is expected that connection reliability between the LSI chips and the module substrate is decreased.

A printed wiring board according to an embodiment of the present invention includes: a core substrate that has a core material having a first surface and a second surface on an opposite side with respect to the first surface, a third conductor layer formed on the first surface, a fourth conductor layer formed on the second surface, and through-hole conductors penetrating the core material and connecting the third conductor layer and the fourth conductor layer to each other; and a first build-up layer that is formed on the first surface of the core material and on the third conductor layer. The first build-up layer has: multiple first resin insulating layers; first conductor layers respectively formed on the first resin insulating layers; and first via conductors penetrating the first resin insulating layers and connecting to the first conductor layers. The first build-up layer is divided into a central area, and an outer peripheral area surrounding the central area. Among the first via conductors, those formed in the central area are central area first via conductors. Among the first via conductors, those formed in the outer peripheral area are outer peripheral area first via conductors. A diameter of each of the central area first via conductors is smaller than a diameter of each of the outer peripheral area first via conductors. The first resin insulating layers include a lowermost first resin insulating layer covering the first surface of the core material and the third conductor layer and include an outermost first resin insulating layer. The first conductor layers include an outermost first conductor layer formed on the outermost first resin insulating layer. The outermost first conductor layer has first pads for mounting a first electronic component and second pads for mounting a second electronic component. The first pads and the second pads are connected to each other via the central area first via conductors. None of the first via conductors are formed in the lowermost first resin insulating layer in the central area.

A printed wiring board according to an embodiment of the present invention has the central area and the outer peripheral area surrounding the central area. The diameter of each of the via conductors formed in the outer peripheral area is larger than the diameter of each of the via conductors formed in the central area. Further, none of the via conductors are formed in the lowermost resin insulating layer in the central area. Therefore, even when the printed wiring board of the embodiment is divided into the central area and the outer peripheral area, strength of the central area and strength of the outer peripheral area are well balanced. Even when multiple electronic components are mounted on the printed wiring board of the embodiment, connection reliability between the electronic components and the printed wiring board can be increased. For example, even when the number of the via conductors formed in each resin insulating layer is different between the resin insulating layers, the connection reliability is unlikely to decrease.

Obviously, numerous modifications and variations of the present invention are possible in light of the above teachings. It is therefore to be understood that within the scope of the appended claims, the invention may be practiced otherwise than as specifically described herein.

The invention claimed is:
1. A printed wiring board, comprising:
a core substrate; and
a first build-up layer formed on the core substrate,
wherein the core substrate includes a core material, a third conductor layer formed on a first surface of the core material, a fourth conductor layer formed on a second surface of the core material on an opposite side with respect to the first surface, and a plurality of through-hole conductors penetrating through the core material and connecting the third conductor layer and the fourth conductor layer, the first build-up layer is formed on the first surface of the core material and the third conductor layer and includes a plurality of first resin insulating layers, a plurality of first conductor layers formed on the first resin insulating layers respectively, and a plurality of first via conductors penetrating through the first resin insulating layers and connecting the first conductor layers, the first build-up layer has a central area and an outer peripheral area surrounding the central area formed such that the plurality of first via conductors includes a plurality of central area first via conductors formed in the central area and a plurality of outer peripheral area first via conductors formed in the outer peripheral area, that a diameter of each of the central area first via conductors is smaller than a diameter of each of the outer peripheral area first via conductors, that the plurality of first resin insulating layers includes a lowermost first resin insulating layer covering the first surface of the core material and the third conductor layer and includes an outermost first resin insulating layer, that the plurality of first conductor layers includes an outermost first conductor layer formed on the outermost first resin insulating layer and including a plurality of first pads positioned to mount a first electronic component to the first build-up layer and a plurality of second pads positioned to mount a second electronic component to the first build-up layer, that the first and second pads are connected to each other via the central area first via conductors, and that the lowermost first resin insulating layer does not have the first via conductors formed in the central area of the first build-up layer, and the first build-up layer is formed such that the lowermost first resin insulating layer has the first via conductors formed in the outer peripheral area and that all wirings in the central area connect the first pads and the second pads to each other.

2. The printed wiring board according to claim 1, wherein the first build-up layer is formed such that a wiring formed in the central area is electrically independent from the third conductor layer of the core substrate.

3. The printed wiring board according to claim 2, wherein the first build-up layer is formed such that a wiring formed in the core substrate is electrically independent from a wiring formed in the central area.

4. The printed wiring board according to claim 1, wherein the first build-up layer is formed such that the first and second pads are connected to each other not via the outer peripheral area first via conductors.

5. The printed wiring board according to claim 1, wherein the first build-up layer is formed such that the central area is electrically independent from the outer peripheral area.

6. The printed wiring board according to claim 5, wherein the first build-up layer is formed such that no wiring is formed to electrically connect the central area and the outer peripheral area.

7. The printed wiring board according to claim 1, wherein the plurality of first via conductors is formed such that a ratio of the diameter of each of the outer peripheral area first via conductors to the diameter of each of the central area first via conductors is set to be larger than 2.

8. The printed wiring board according to claim 1, wherein the first electronic component is a logic IC, and the second electronic component is a memory.

9. The printed wiring board according to claim 1, further comprising:
a plurality of metal posts formed on the first and second pads respectively.

10. The printed wiring board according to claim 1, wherein the first build-up layer is configured to supply power to the first electronic component and the second electronic component via wirings formed in the outer peripheral area.

11. The printed wiring board according to claim 2, wherein the first build-up layer is formed such that the first and second pads are connected to each other not via the outer peripheral area first via conductors.

12. The printed wiring board according to claim 2, wherein the first build-up layer is formed such that the central area is electrically independent from the outer peripheral area.

13. The printed wiring board according to claim 12, wherein the first build-up layer is formed such that no wiring is formed to electrically connect the central area and the outer peripheral area.

14. The printed wiring board according to claim 2, wherein the plurality of first via conductors is formed such that a ratio of the diameter of each of the outer peripheral area first via conductors to the diameter of each of the central area first via conductors is set to be larger than 2.

15. The printed wiring board according to claim 2, wherein the first electronic component is a logic IC, and the second electronic component is a memory.

16. The printed wiring board according to claim 2, further comprising:
a plurality of metal posts formed on the first and second pads respectively.

17. The printed wiring board according to claim 2, wherein the first build-up layer is configured to supply power to the first electronic component and the second electronic component via wirings formed in the outer peripheral area.

18. The printed wiring board according to claim 3, wherein the first build-up layer is formed such that the first and second pads are connected to each other not via the outer peripheral area first via conductors.

19. The printed wiring board according to claim 3, wherein the first build-up layer is formed such that the central area is electrically independent from the outer peripheral area.

20. The printed wiring board according to claim 19, wherein the first build-up layer is found such that no wiring is formed to electrically connect the central area and the outer peripheral area.

* * * * *